US012009842B2

(12) United States Patent
Wang

(10) Patent No.: US 12,009,842 B2
(45) Date of Patent: Jun. 11, 2024

(54) ERROR CORRECTING CODE CIRCUITRY COMPATIBLE WITH MULTI-WIDTH INTERFACES

(71) Applicant: Intel Corporation, Santa Clara, CA (US)

(72) Inventor: Qiang Wang, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 763 days.

(21) Appl. No.: 16/723,910

(22) Filed: Dec. 20, 2019

(65) Prior Publication Data

US 2020/0125446 A1 Apr. 23, 2020

(51) Int. Cl.
*H03M 13/00* (2006.01)
*G06F 11/10* (2006.01)
*G06F 13/16* (2006.01)

(52) U.S. Cl.
CPC ..... *H03M 13/6356* (2013.01); *G06F 11/1076* (2013.01); *G06F 13/1678* (2013.01)

(58) Field of Classification Search
CPC ............. G06F 11/1076; G06F 13/1678; G06F 11/1012; H03M 13/27; H03M 13/19; H03M 13/6356; H03M 13/6516; Y02D 10/00
See application file for complete search history.

(56) References Cited

U.S. PATENT DOCUMENTS

| | | | | |
|---|---|---|---|---|
| 7,143,329 B1* | 11/2006 | Trimberger | ...... | H03K 19/17764 714/766 |
| 7,574,541 B2* | 8/2009 | Liav | ................ | G11B 20/10527 710/29 |
| 8,281,224 B1* | 10/2012 | Kou | .................... | G11B 20/1833 714/780 |
| 9,263,136 B1* | 2/2016 | Zhao | ..................... | G11C 16/349 |
| 9,424,929 B1* | 8/2016 | Yamaki | ................ | G11C 7/1006 |
| 2003/0210740 A1* | 11/2003 | Efland | ..................... | H04L 45/00 375/222 |
| 2008/0201625 A1* | 8/2008 | Mulligan | .............. | H04L 1/0057 714/763 |
| 2011/0283166 A1* | 11/2011 | Kim | ...................... | G06F 11/106 714/E11.034 |
| 2011/0320915 A1* | 12/2011 | Khan | .................. | G06F 11/1048 714/763 |
| 2012/0260149 A1* | 10/2012 | Chang | ................... | H03M 13/13 714/763 |
| 2013/0117630 A1* | 5/2013 | Kang | .................. | G06F 11/1048 714/763 |
| 2013/0227376 A1* | 8/2013 | Hwang | ............. | H03M 13/6356 714/776 |
| 2013/0290615 A1* | 10/2013 | Shah | ..................... | G06F 3/0679 711/161 |

(Continued)

*Primary Examiner* — Steve N Nguyen
(74) *Attorney, Agent, or Firm* — Fletcher Yoder, P.C.

(57) ABSTRACT

Systems and methods described herein may relate to providing a dynamically configurable error correction code (ECC) circuitry able to process data having one of a variety of widths. This multi-width ECC circuitry may generate error correction code bits (ECC bits) using, for example, an encoder or a decoder characterized by a fixed data width. Translation circuitry (e.g., a format converter) may translate data received from data utilization circuitry between a data width used by the data utilization circuitry and the fixed data width used by the encoder or the decoder.

19 Claims, 9 Drawing Sheets

(56) References Cited

U.S. PATENT DOCUMENTS

| | | | |
|---|---|---|---|
| 2015/0067436 A1* | 3/2015 | Hu | G06F 12/0238 |
| | | | 714/758 |
| 2016/0284386 A1* | 9/2016 | McCall | G06F 11/3037 |
| 2016/0350187 A1* | 12/2016 | Saliba | H03M 13/353 |
| 2017/0220256 A1* | 8/2017 | Balasubramonian | |
| | | | G06F 11/1048 |
| 2017/0255508 A1* | 9/2017 | Lee | G06F 11/1016 |
| 2018/0212623 A1* | 7/2018 | Kim | H03M 13/1111 |

\* cited by examiner

ERROR CORRECTING CODE CIRCUITRY COMPATIBLE WITH MULTI-WIDTH INTERFACES

BACKGROUND

The present disclosure relates generally to memory interface circuitry for integrated circuit devices and, more particularly, memory interface circuitry that can flexibly support different data widths.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Advances in microelectronics have enabled the continued increase in transistor densities for a variety of integrated circuit devices. Indeed, some advanced integrated circuits, such as field programmable gate arrays (FPGAs) or other programmable logic devices, may include large number of transistors that enable an increasingly wide variety of programmable circuit designs that may implement a large number of different functions. In some programmable logic devices, data generated by the functions may be packetized and routed to or from a memory of the programmable logic device to execute an operation. However, since a circuit design for a programmable logic device may not be known in advance, a memory interface unable to accommodate a variety of data transmission widths may be unable to accommodate certain data transmission operations when programmable logic device performs operations to generate or use data having different data widths.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

Figure 1:
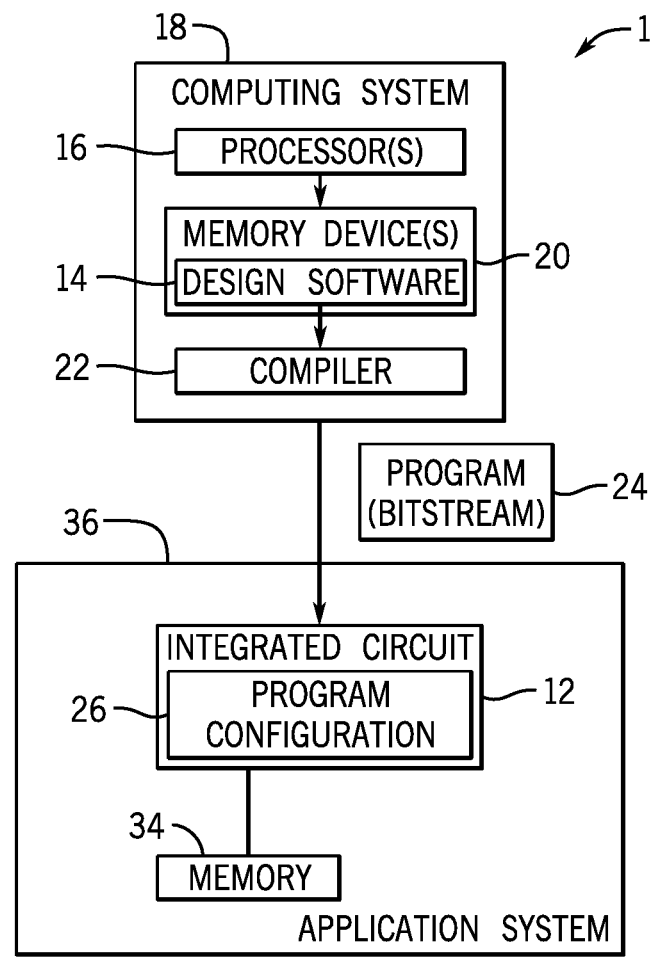
FIG. 1 is a block diagram of a computing system that may be used to program an integrated circuit system having a multiple width error correction code circuitry (multi-width ECC circuitry), in accordance with an embodiment.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Programmable logic devices such as field programmable gate arrays (FPGAs) are advanced integrated circuits that have proven their value for processing operations and, as a result, many new use cases for programmable logic devices have evolved and emerged. An FPGA may use an external memory. Data may be routed between different areas of a programmable logic device and an external memory of the programmable logic device using memory interface circuitry. However, programmable logic devices, as well as other integrated circuits, may use memory interface circuitry that includes error correction code circuitry for verifying data integrity of read data from the memory. Since a programmable logic device may be flexible in its ultimate use, an FPGA may support multiple memory interface widths, such as 8 bits, 16 bits, 32 bits, 64 bits, or the like of data bits, thus, the error correction code circuitry of the multi-width memory may be desired to support multiple memory interface widths.

To address this, multiple error correction code circuitries may be included to support multiple memory interface widths. Using multiple error correction code circuitries, one for each of the data widths, in the memory interface circuitry may increase an amount of silicon area and power consumption of the memory interface circuitry. Using multiple error correction code circuitries may also be inefficient when multiple sets of multiple error correction code circuitries are used for a single memory interface circuitry.

Another way to support multiple memory interface widths is to design error correction code circuitry that is able to encode and decode multiple data widths. Error correction code circuitry that is able to encode and decode multiple data widths may reduce the amount of silicon area and power consumption of the memory interface circuitry from the above approach. To do so, the error correction code circuitry may include encoding or decoding circuitry of one fixed width. The error correction code circuitry may also include a format converter to translate an input and/or an output from the encoding or decoding circuitry into a width usable by the memory and/or by the FPGA. The format converter may process data of a variety of widths, where a maximum width able to be processed by the format converter may match the fixed width of the encoding or decoding circuitry. Using the error correction code circuitry that includes the format converter may reduce an amount of silicon area used, may reduce an amount of routing used to interconnect components associated with the error correction code circuitry, and may reduce power consumed by the error correction code circuitry. The error correction code circuitry may improve signal integrity and power consumption of the memory interface. These implementations described herein may be carried out in programmable logic devices (e.g., FPGAs), application-specific integrated circuits (ASICs), or any other suitable device (e.g., a suitable processor running instructions to carry out the programmable interconnect network implementations of this disclosure).

With the foregoing in mind, FIG. 1 illustrates a block diagram of a system 10 that may be used to program an integrated circuit 12. The integrated circuit 12 may be at least partially reconfigurable (e.g., include one or more FPGAs) or may be an application-specific integrated circuit (ASIC). A user may implement a circuit design to be programmed onto the integrated circuit 12 using design software 14, such as a version of Quartus by Intel®. The design software 14 may be executed by one or more processors 16 of a computing system 18. The computing system 18 may include any suitable device capable of executing the design software 14, such as a desktop computer, a laptop, a mobile electronic device, a server, or the like. The computing system 18 may access, configure, and/or communicate with the integrated circuit 12. The processor(s) 16 may include multiple microprocessors, one or more other integrated circuits (e.g., ASICs, FPGAs, reduced instruction set processors, and the like), or some combination of these.

One or more memory devices 20 may store the design software 14. In addition, the memory device(s) 20 may store information related to the integrated circuit 12, such as control software, configuration software, look up tables, configuration data, or the like. In some embodiments, the processor(s) 16 and/or the memory device(s) 20 may be external to the computing system 18. The memory device(s) 20 may include a tangible, non-transitory, machine-readable-medium, such as a volatile memory (e.g., a random access memory (RAM)) and/or a nonvolatile memory (e.g., a read-only memory (ROM)). The memory device(s) 20 may store a variety of information that may be used for various purposes. For example, the memory device(s) 20 may store machine-readable and/or processor-executable instructions (e.g., firmware or software) for the processor(s) 16 to execute, such as instructions to determine a speed of the integrated circuit 12 or a region of the integrated circuit 12, determine a criticality of a path of a design programmed in the integrated circuit 12 or a region of the integrated circuit 12, programming the design in the integrated circuit 12 or a region of the integrated circuit 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design program 24 (e.g., bitstream), sometimes known as a program object file, which programs the integrated circuit 12. That is, the compiler 22 may provide machine-readable instructions representative of the circuit design to the integrated circuit 12. For example, the integrated circuit 12 may receive one or more programs 24 as bitstreams that describe the hardware implementations that should be stored in the integrated circuit 12. The programs 24 (e.g., bitstreams) may programmed into the integrated circuit 12 as a program configuration 26.

Figure 2:
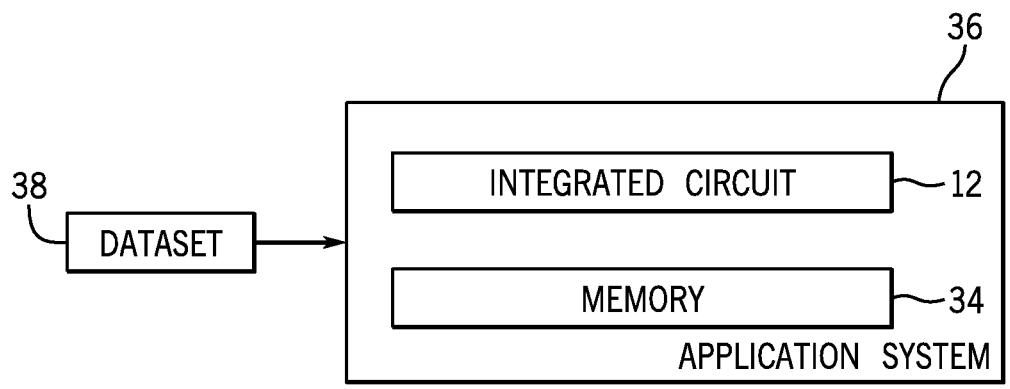
FIG. 2 is a block diagram of the integrated circuit system of FIG. 1 programmed by the computing system of FIG. 1, in accordance with an embodiment.

A controller may receive the programs 24 (bitstreams) and operate to configure the integrated circuit 12 according to the programs 24 (bitstreams). For example, as depicted in FIG. 2, the integrated circuit 12 may be an FPGA that may be reconfigured according to the programs 24 (bitstreams) to perform a wide range of tasks and/or functions. It is noted that although the integrated circuit 12 may be programed according to the programs 24, additional circuitry, such as a memory 34 (e.g., memory external to the integrated circuit 12), may be included in an application system 36 that includes the integrated circuit 12 to permit the integrated circuit 12 to perform operations on a received dataset.

For example, FIG. 2 is a block diagram of an example application system 36 receiving a dataset 38 after being programmed at least partially by the computing system 18. The integrated circuit 12 may operate as part of the application system 36 to assist in processing the dataset 38. The application system 36 may represent, for example, a computing device in a datacenter, which may process network traffic, image data, video data, financial data, or any other suitable form of data. It is noted that although not particularly depicted, the application system 36 may include one or more additional processing circuitries, such as a processor core complex, to help the integrated circuit 12 in processing the dataset 38 and/or to perform other operations at least partially in parallel to operations of the integrated circuit 12. For example, additional processing circuitries may execute instructions (e.g., software or firmware) stored in memory 34 to receive and route the dataset 38, to control the integrated circuit 12, or the like. For instance, the additional processing circuitries may run software to analyze network traffic, image data, video data, financial data, or any other suitable form of data. The memory 34 may store the one or more programs 24 (bitstreams) that may be used to program a programmable logic fabric of the integrated circuit 12 (e.g., when the integrated circuit 12 is a programmable logic device (PLD), such as a FPGA).

Figure 3:
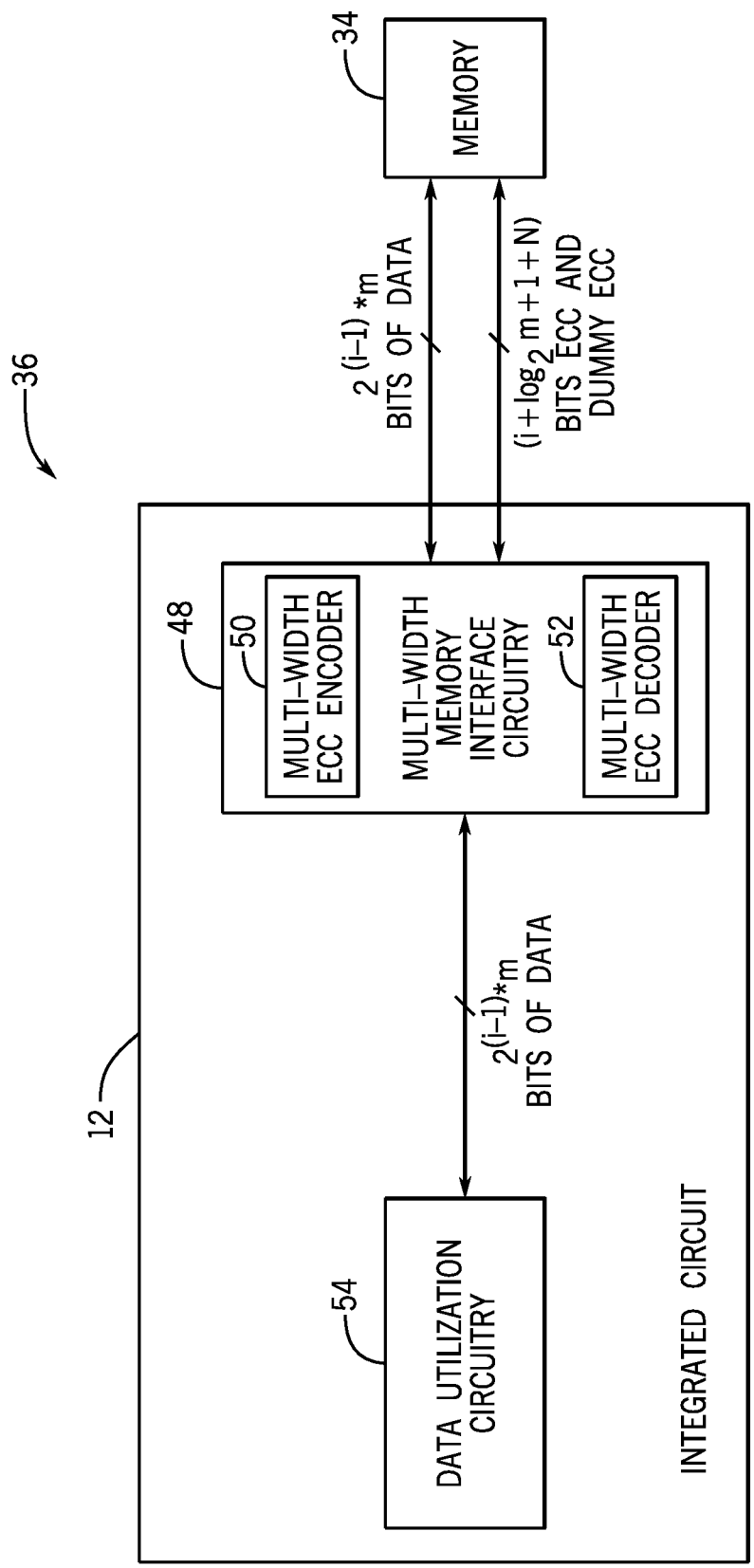
FIG. 3 is a block diagram of the multi-width memory interface circuitry of the integrated circuit system of FIG. 2 that includes a multi-width ECC encoder and a multi-width ECC decoder, in accordance with an embodiment.

FIG. 3 is a block diagram of the system that includes a multiple width compatible memory interface circuitry (multi-width memory interface circuitry) 48 of the integrated circuit 12. The multi-width memory interface circuitry 48 may include a codec device that includes a multi-width ECC encoder 50 and multi-width ECC decoder 52. The integrated circuit 12 may include data utilization circuitry 54. The integrated circuit 12 may have an external memory 34 and may access the external memory using a memory interface, such as via a high-speed memory interface. The memory interface may include data bits and error correct code (ECC) bits. When a number of data bits (i.e., data width) able to be handled by the memory interface is M, the number of ECC bits used by the memory interface may be ($\log_2(M)$+2) bits, such that the memory interface has at least (M+$\log_2(M)$+2) bits of width. Because a typical commercial memory chip has a width of a multiple of 4 bits, 8 bits, or 16 bits, the memory interface may also include one or more dummy ECC bits with the ECC bits to permit the memory interface to transmit the ECC bits to the memory 34. Thus, a total width of the memory interface may be (M+$\log_2(M)$+2+N) bits, where the N is the number of the dummy ECC bits in the memory interface.

In some cases, the data utilization circuitry 54 may include programmable logic fabric that is programmable (and reprogrammable) based on the programs 24 (bitstreams). The data utilization circuitry 54 may include a number of programmable logic elements having operations defined by configuration memory (e.g., configuration random access memory (CRAM)). The programmable logic elements may include look-up tables, registers, multiplexers, routing wires, and so forth. A designer may program the data utilization circuitry 54 to perform a variety of desired functions. Portions or regions of the data utilization circuitry 54, in particular portions of the programmable logic fabric, may be programmed to perform different functions and/or replications of the same function. Sometimes, the data utilization circuitry 54 is programmed to interact with other circuitry via interconnect boundary circuitry. The other circuitry may include any combination of memories, transceivers, ASICs, and/or any suitable circuitry that may also be used in addition to data utilization circuitry 54 to perform processing or functional operations associated with the integrated circuit 12.

The variety of desired functions may use different memory data widths. In some cases, the data utilization circuitry 54 may be designed to communicate with the memory 34 multi-width memory interface circuitry 48 using a first data width for a first function (e.g., at a first time) and using a second data width for a second function (e.g., at a second time). In general, it is desirable for the integrated circuit 12 to support k data widths for the memory 34. Hence, the multi-width memory interface circuitry 48 may process both data having the first data width and data having the second data width. In this way, the data utilization circuitry 54 may communicate with the memory 34 using a respective data width of a variety of data widths. The multi-width memory interface circuitry 48 may include a multi-width ECC decoder 52 and a multi-width ECC encoder 50. The multi-width ECC decoder 52 and the multi-width ECC encoder 50 may be built by using a fixed data width (i.e., single-width) ECC decoder and encoder that communicate with format converters to translate data having the respective data width into data having the fixed data width. It is noted that the respective single-width decoding and encoding circuitries may have different data widths or the same data widths. Discussions related to the encoding circuitry are made with reference to FIGS. 4-10 while discussions related to decoding circuitry are made with reference to FIGS. 11 and 12. It is noted that examples of FIGS. 5-9 and the example shown in FIG. 4 that depict example output patterns from the format converter may be applicable the encoding circuitry and/or the decoding circuitry.

Figure 4:
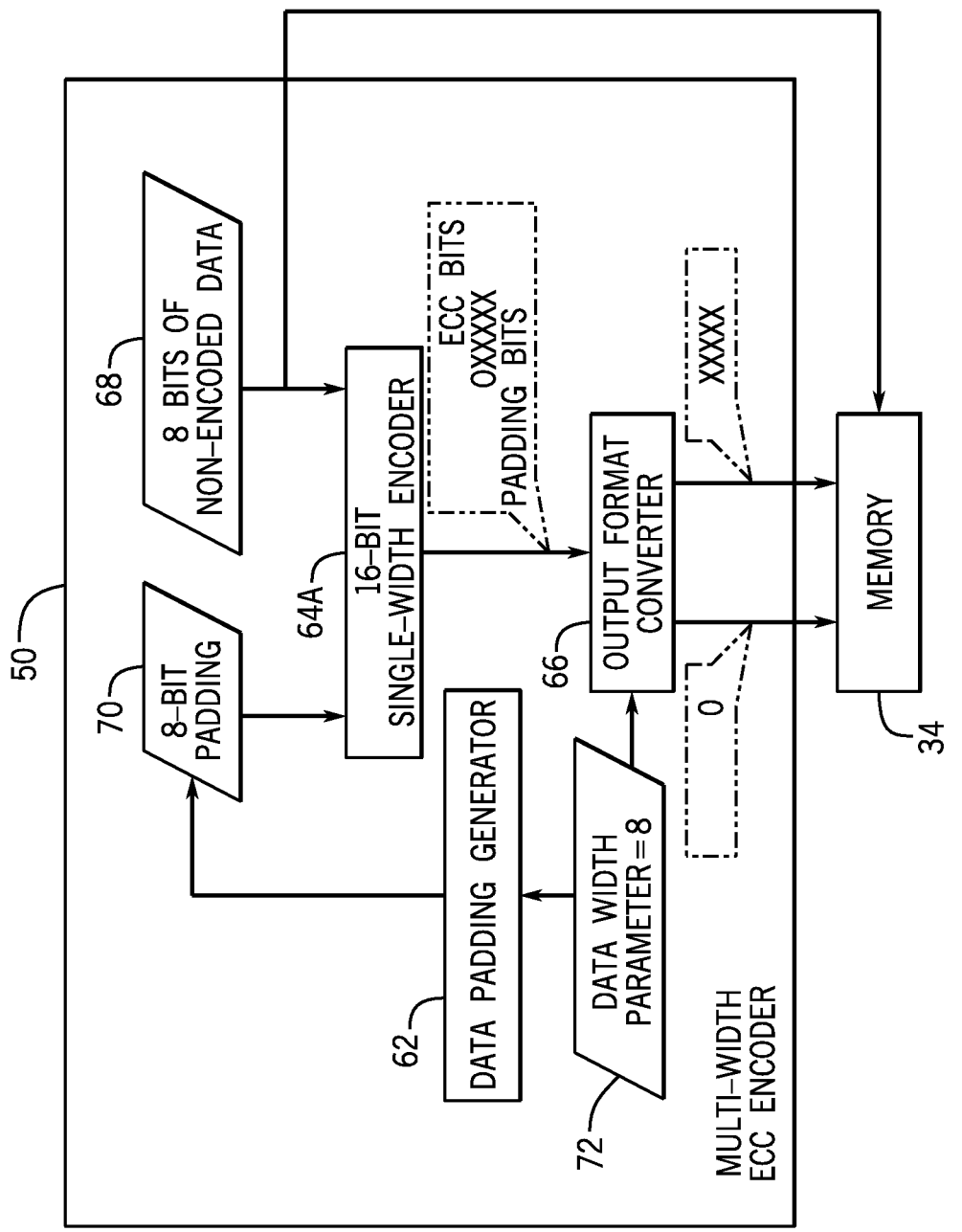
FIG. 4 is a block diagram of an example of 16-bit encoding circuitry of the multi-width ECC encoder of FIG. 3, in accordance with an embodiment.

To elaborate, FIG. 4 is a block diagram of an example multi-width ECC encoder 50 that supports multiple memory data widths, such as 8 and 16 bits memory data width. The multi-width ECC encoder 52 is includes a single-width 16-bit ECC encoder (e.g., single-width encoder 64A), which takes 16 bits of input data and generates 6 bits of error correction code (ECC) data. When the memory data is 8 bits, which is less than 16 bits, it the memory data is padded with 8 bits of zeros at the most significant bit (MSB) position by the data padding generator 62 before sending to the single-width encoder 64A. Output bits from the single-width encoder 64A may be transmitted to an input of an output format converter 66. The output format converter 66 may adjust the output bits from the single-width encoder 64A to generate another output that has a format that is compatible with and/or optimized for the memory 34. The output format converter 66 may also output the ECC bits of the 8 bit memory data and any additional dummy ECC bits to match the width of the memory data to the width of the memory interface. The memory 34 stores error correction code (ECC) bits from the output format converter 66 and non-encoded data 68 from the data utilization circuitry 54. When the non-encoded data 68 and its associated ECC and dummy ECC bits are retrieved from memory 34, these retrieved data from memory 34 are used by a decoder to verify the data integrity of the non-encoded data 68 after being stored in the memory 34.

To do so, the single-width encoder 64A may include circuitry that performs a hamming error correction code (hamming ECC) operation to determine the encoded output. The hamming ECC operation may correct a single bit error and detect a double bit error. The hamming ECC operation may include exclusive-or-ing (XORing) bits of the non-encoded data 68 based on a Syndrome Table to generate the ECC bits corresponding to the non-encoded data 68.

XORing a bit with a zero bit (e.g., 0, logical low value) results in the bit. Thus, when 8 bits of the non-encoded data 68 are input into the single-width encoder 64A and padded with 8 bits of zeros (e.g., data padding 70), the single-width encoder 64A may generate 6 output bits, and the least significant 5 bits of the 6 output bits may be the ECC bits of the 8 bits non-encoded data 68 while the remaining most significant 1 bit of the 6 output bits is a dummy bit equal to 0.

In order to support ECC for 8 bits memory data width, the memory interface should have at least 13 bits, which includes 5 ECC bits. Because commercial memory chips typically have a width of multiple of 4 bits, 8 bits, or 16 bits, the memory interface width may be a data width between 13 bits and 16 bits. When the memory interface is characterized by a data width of 14 bits, none of the dummy data may be discarded. When the memory interface is characterized by a data width of 13 bits, the one dummy ECC data bit may be discarded and the ECC data may be transmitted to the memory 34. However, when the memory interface is 16 bits, the output format converter may discard the dummy bit output from the single-width encoder 64A and translate the 5 ECC bits from the single-width encoder 64A into 8 bits on the memory interface in a preferred pattern (e.g., XXDXDXDX) that includes the 5 ECC bits and 3 additional dummy ECC bits (e.g., XXDXDXDX, DDDXXXXX, XDXDXDXX, . . . , XXXXXDDD) used as padding to transmit the 5 ECC bits to the memory 34. It is noted that the ECC bits are represented by "X" since the bit may be a 1 or a 0, while the dummy ECC bits are represented by "D" that may be set to a known value (e.g., 0).

When the 16 bits of the non-encoded data 68 are input into the multi-width encoder 50, the single-width encoder 64A may receive the 16 bits without any padding and generate 6 output bits. Each of the 6 bits may be ECC bits corresponding to the 16 bits of the non-encoded data 68 and, in this case, none of the 6 bits may be dummy ECC bits. To support ECC operations for 16 bits memory data width, the multi-width memory interface circuitry 48 may be at least 22 bits to suitably transmit 16 data bits and 6 ECC bits. Since memory chips may have widths of multiples of 4 bits, 8 bits, or 16 bits, the multi-width memory interface circuitry 48 at output to the memory 34 may be between 22 bits and 24 bits. When a data width of the memory interface is 24 bits, the output format converter may translate the 6 ECC bits from the single-width encoder 64A into 8 bits on the memory interface in a preferred pattern (e.g., XXDXXDXX, XXXDXDXX, . . . , XXXXXXDD) since 8 bits added to 16 bits equals 24 bits, which include the 6 ECC bits and 2 dummy ECC bits.

If the single-width 16-bit encoder 64A were to be replaced by a single-width 32-bit encoder, the 32-bit encoder may receive the non-encoded data 68 and data padding 70 to increase a data width of the 8 bits of non-encoded data 68 from 8 bits to 32 bits (e.g., 24 bits of padding and 8 bits of non-encoded data). The single-width 32-bit encoder may generate 7 output bits. The least significant 5 bits of the 7 output bits may correspond to the 5 ECC bits of the 8 bit non-encoded data 68 and the most significant 2 bits of the 7 output bits may correspond to 2 dummy bits equal to 0. When the memory interface is 16 bits, the output format converter may translate the 7 ECC bits from the single-width encoder 64A into 8 bits on the memory interface in a preferred pattern (e.g., XXXXDXXX, . . . , XXXXXXXD), which may include the 7 ECC bits and 1 dummy ECC bit.

The output format converter 66 may receive a data width parameter 72 that specifies a data width of the non-encoded data 68. The output format converter 66 may reconfigure its settings to suitably process (e.g., convert) the output from the single-width encoder 64A into a format suitable for storage in the memory 34. In particular, the output format converter 66 may reference a look-up table to determine how many output bits from the single-width encoder 64A are dummy bits, how many output bits are ECC bits based on the data width parameter 72, and/or how many bits wide is the non-encoded data 68. The ECC bits may be bits stored into the memory 34 for future retrieval to verify the non-encoded data 68 also stored in the memory 34. The output format converter 66 may receive a format parameter 80 specifying at what bit position to transmit the dummy bit and/or at what value to output as the dummy bit (e.g., logical high, logical low). It is noted that the output format converter 66 may include hardware, software, or a combination of the two to perform the translation operations described herein. In this way, the output format converter 66 may include or be processing circuitry similar to that used as the processors 16 or other suitable processing or control circuitry. Similarly, the data padding generator 62 may receive the data width parameter 72 in order to generate the corrected data padding 70.

Figure 5:
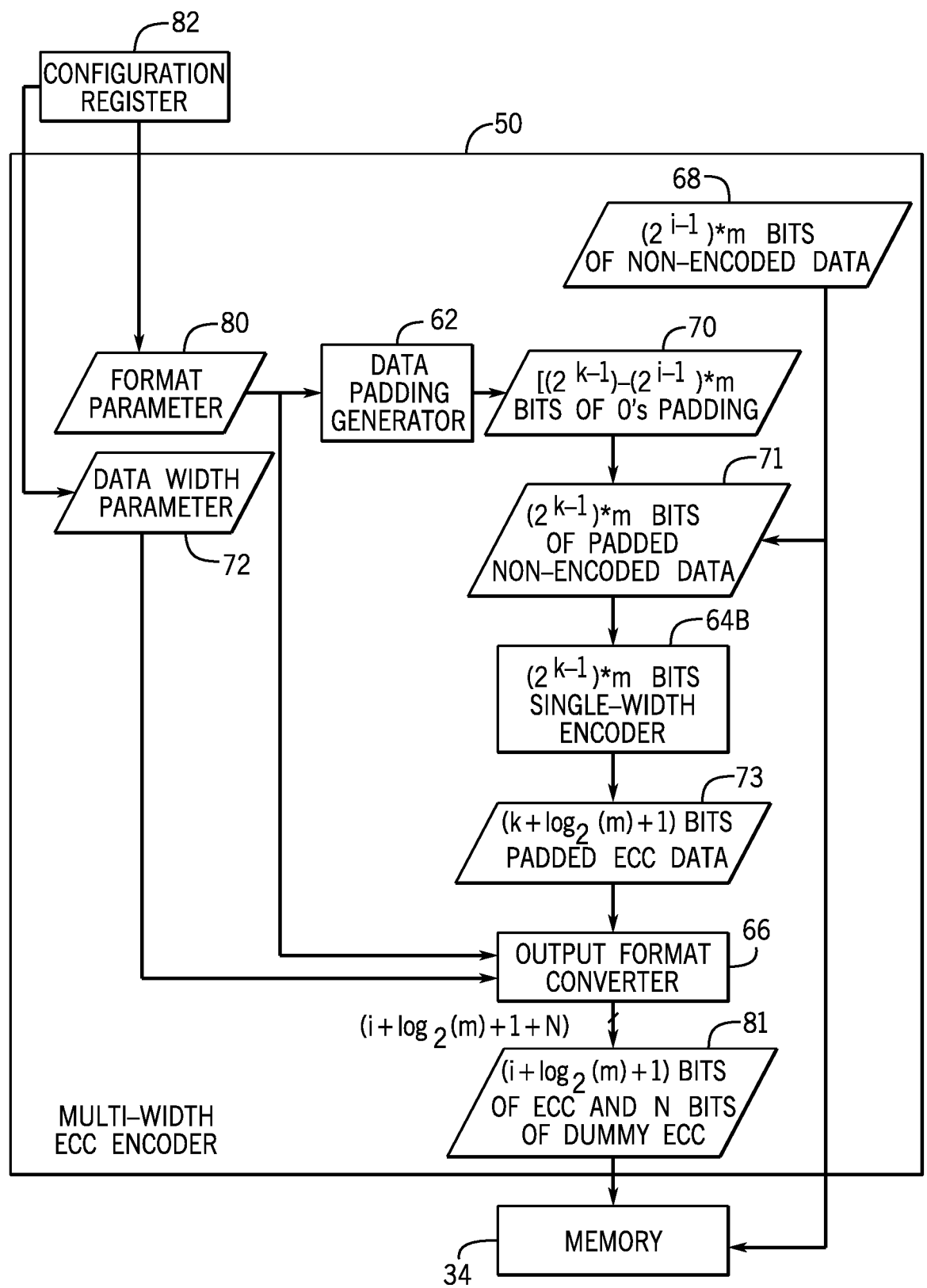
FIG. 5 is a block diagram of an example k*m bit encoding circuitry of the multi-width ECC encoder of FIG. 3, in accordance with an embodiment.

The multi-width ECC encoder 50 described in FIG. 4 may be generalized in FIG. 5 to show a multi-width ECC encoder 50 that supports k memory data widths, $M_1, M_2, \ldots,$ and $M_k$ bits, respectively, where $M_1 < M_2 < \ldots < M_k$. The memory data widths (M) may correspond to $M_i = 2^{(i-1)} * m$, for i=1, 2, 3, . . . , k, where the k is the number of data widths (e.g., k different data widths), the m is the minimum data width of the multi-width encoder (e.g., a minimum data width of the configurable ECC circuitry), and the $2^{(k-1)} * m$ is the maximum data width of the multi-width encoder 50. Hence, $M_1$, $M_2, \ldots,$ and $M_k$ equal m, 2*m, 4*m, . . . $2^{(k-1)} * m$, respectively (e.g., $M_2 = 2*m$ thereby the number of ECC bits is a function of the number of input bits such that when the number of input bits is a function of m, the number of ECC bits is also a function of the m). FIG. 5 is a block diagram of an example multi-width ECC encoder 50 that supports k memory data widths from m bits to $2^{(k-1)} * m$ bits. The multi-width ECC encoder 50 includes a single-width ECC encoder (e.g., single-width encoder 64B) of $2^{(k-1)} * m$ data width, which takes $2^{(k-1)} * m$ bits input data and generates $(k + \log_2(m) + 1)$ bits of ECC bits.

The non-encoded data 68 of $2^{(i-1)} * m$ bits, for i=1, 2, . . . , or k, it may be appended with data padding 70 having a data width equal to $(2^{(k-1)} - 2^{(i-1)}) * m$ bits to form $2^{(k-1)} * m$ bits of padded non-encoded data 71 before sending to the single-width encoder 64B. The data padding 70 effectively increases the input data width for the single-width encoder 64B having a size equal to $2^{(k-1)} * m$ bits. The single-width encoder 64B may generate $(k + \log 2(m) + 1)$ bits of padded ECC data 73, which includes $(i + \log 2(m) + 1)$ ECC bits of the non-encoded data 68 and $(k-i)$ dummy ECC bits of zeros. In this way, when i=k the data width of the single-width encoder 64B may equal a width of the input data (i.e., i=k), there may be no padding for the non-encoded data 68. Thus, the output from the encoder 64B may include zero dummy ECC bits. The output format converter 66 may discard the $(k-i)$ dummy bits from the single-width encoder 64B and translate the remaining $(i + \log 2(m) + 1)$ ECC bits from the single-width encoder 64B to $(i + \log 2(m) + 1 + N)$ bits on the memory interface in a preferred pattern, which include the $(i + \log 2(m) + 1)$ ECC bits and N dummy ECC bits (e.g., represented by $(i + \log 2(m) + 1)$ bits of ECC and N bits of dummy ECC 81).

As depicted in FIG. 4, the output format converter 66 may receive the data width parameter 72 that indicates a data width of the non-encoded data 68 from a configuration register 82. In some cases, the output format converter 66 also receives one or more format parameters 80 from a configuration register 82. The format parameters 80 may specify whether and/or how the output format converter 66 interleaves the ECC bits from the single-width encoder 64B with one or more dummy ECC bits and/or what value to set the dummy ECC bits to (e.g., 0, 1, some other voltage value between the system definition for a logical low voltage and the system definition for a logical high voltage). Combinations of these examples are described below with reference to FIGS. 6-9. It is noted that in FIG. 4, format parameters 80 may have set the output format converter 66 to output ECC bits non-interleaved with the dummy bits (e.g., wherein the ECC data is transmitted separate or adjacent to the dummy bits) and to output dummy bits having a value of 0 (e.g., logical low value). In this way, the multi-width memory interface circuitry 48 may be configurable according to a variety of formats through use of the format parameters 80 and/or the data width parameter 72, and thus may be considered configurable ECC circuitry. It is noted that, in some cases, the output format converter 66 may apply no adjustment to bits output from the single-width encoder 64B, such as in the cases when the width of the memory 34 equals that as output from the single-width encoder 64.

Figure 6:
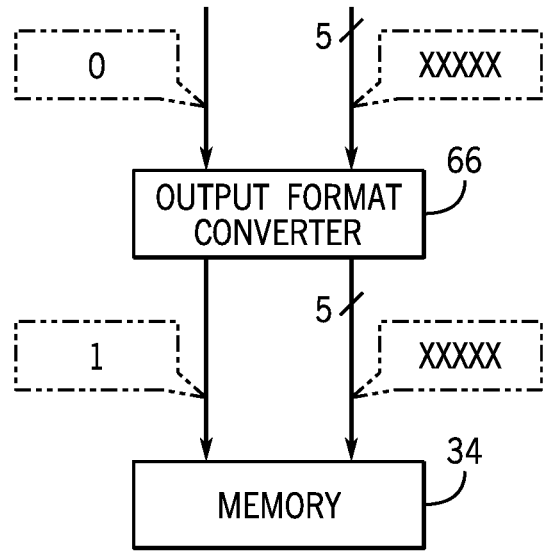
FIG. 6 is a block diagram of a first example output pattern of output format converter circuitry of the multi-width ECC encoder of FIG. 5, in accordance with an embodiment.

FIG. 6 is a block diagram of a first example output pattern of the output format converter 66. The depicted examples in FIGS. 6-9 may be used with a single-width 16-bit encoder 64A that generates 5 ECC bits and 1 dummy ECC bit equal to 0 based on 8 bits of non-encoded data 68. However, it should be understood that the described output patterns may be used with any size of single-width encoder. In this first example, the output format converter 66 may set the value of the dummy bit to 1 (e.g., logical high value) as opposed to 0 or another value. When a reverse operation is performed (e.g., via input format converter of FIG. 11), as is described with regards to FIG. 11 and FIG. 12, the output format converter 66 may replace the dummy bits having a value of 1 with dummy bits having a value of 0, such that a decoder may process the bits. In some cases, replacing the dummy bit value with 1 as opposed to 0 may improve signal integrity and reduce power consumption of the memory interface that is driven by the multi-width memory interface circuitry 48.

Figure 7:
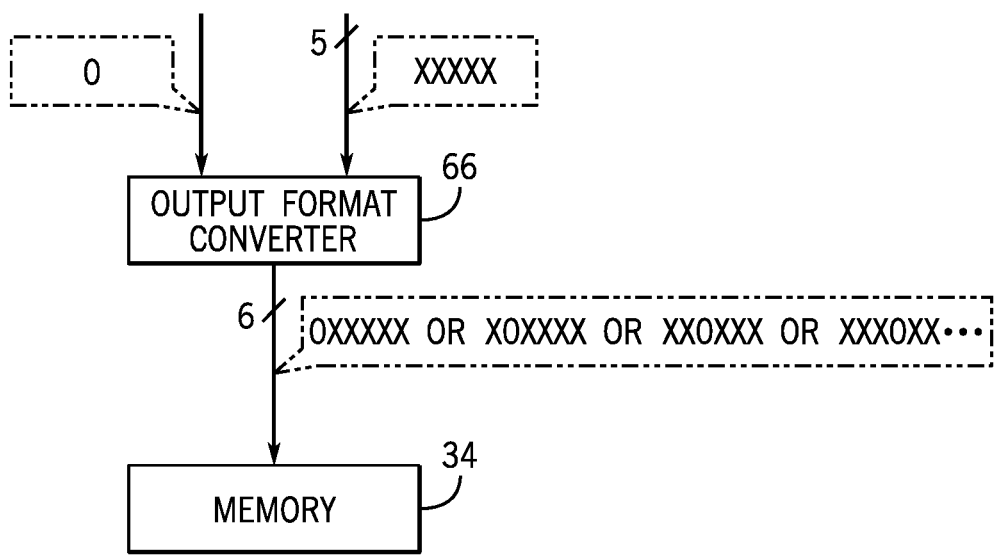
FIG. 7 is a block diagram of a second example output pattern of the output format converter circuitry of the multi-width ECC encoder of FIG. 5, in accordance with an embodiment.

FIG. 7 is a block diagram of a second example output pattern of the output format converter 66. In this second example, the output format converter 66 may interleave the dummy bit output with the ECC data output. The format parameter 80 may define at what bit position to transmit the dummy bit. Shown are several examples of valid bit positions that the dummy bit may be transmitted (e.g., 0XXXXX, X0XXXX, XX0XXX, . . . XXXXX0). When a reverse operation is performed (e.g., via input format converter of FIG. 11), as is described with regards to FIG. 11 and FIG. 12, the output format converter 66 may return the dummy bit having a value of 0 to an original bit position as received from the single-width encoder 64A, such that a decoder may process the bits. For example, the dummy bit may be returned to a most significant bit position relative to the ECC bits (e.g., 0XXXXX) when performing the reverse operation. In some cases, interleaving the dummy bit value with the ECC data may improve signal integrity of the memory interface that is driven by the multi-width memory interface circuitry 48.

Figure 8:
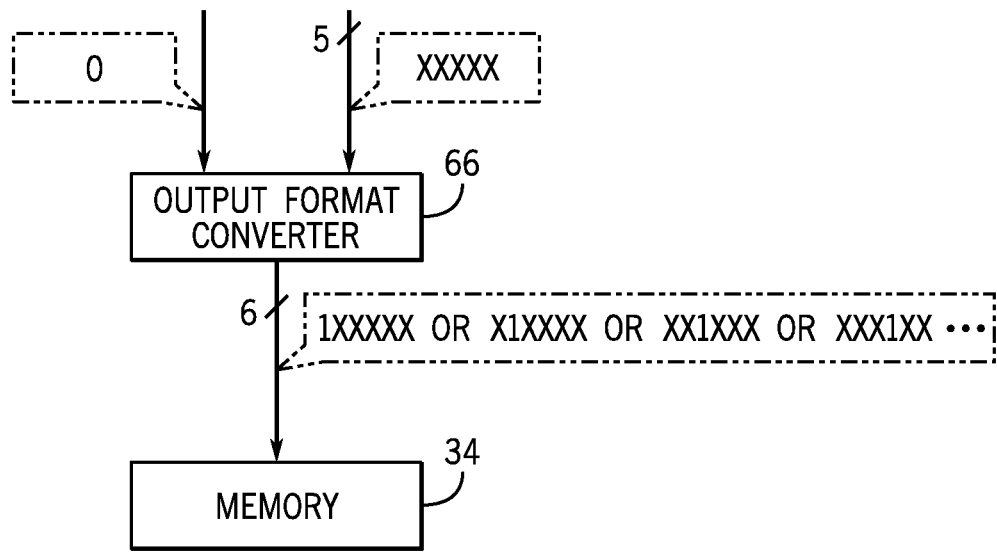
FIG. 8 is a block diagram of a third example output pattern of the output format converter circuitry of the multi-width ECC encoder of FIG. 5, in accordance with an embodiment.

FIG. 8 is a block diagram of a third example output pattern of the output format converter 66. In this third example, the output format converter 66 may interleave the dummy bit output with the ECC data output and the dummy bit output may be set by the output format converter 66 to a value different from 0, such as 1. Format parameters 80 may define at what bit position to transmit the dummy bit and at what value to output as the dummy bit. Shown are several examples of valid bit positions that a dummy bit having a value of 1 may be transmitted (e.g., 1XXXXX, X1XXXX, XX1XXX, . . . XXXXX1). When a reverse operation is performed (e.g., via input format converter of FIG. 11), as is described with regards to FIG. 11 and FIG. 12, the output format converter 66 may return the dummy bit having a value of 1 to an original bit position as received from the single-width encoder 64A and may return the value of the dummy bit to 0, such that a decoder may process the bits. For example, a dummy bit may be returned to a most significant bit position relative to the ECC bits and may be reset to have a value of 0 (e.g., 0XXXXX) when performing the reverse operation. In some cases, interleaving the non-zero dummy bit value with the ECC data may improve signal integrity and reduce power consumption of the memory interface that is driven by the multi-width memory interface circuitry 48.

Figure 9:
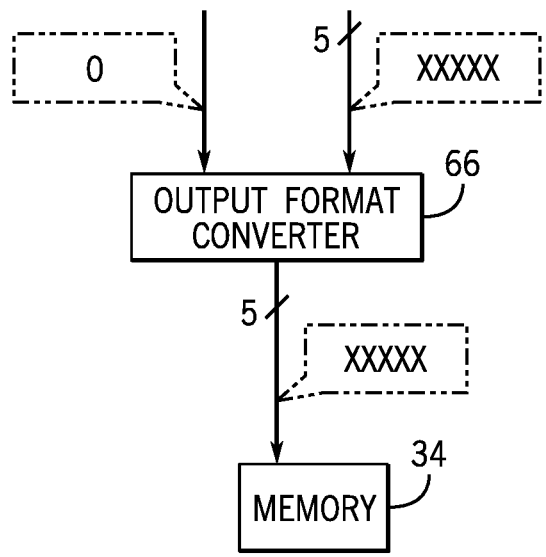
FIG. 9 is a block diagram of a fourth example output pattern of the output format converter circuitry of the multi-width ECC encoder of FIG. 5, in accordance with an embodiment.

FIG. 9 is a block diagram of a fourth example output pattern of the output format converter 66. In this fourth example, the output format converter 66 may not output a dummy bit in such a way that the dummy bit is discarded before sending it out to memory 34. The fourth example output pattern of discarding the dummy bit before saving into memory 34 may be combined with the other examples associated with interleaving the dummy bit output with the ECC data output and/or setting the dummy bit output to a value different from 0, such as 1. Format parameters 80 may define at what bit position to transmit the dummy bit and at what value to output as the dummy bit. In some embodiments, the output from the output format converter 66 that may couple to the memory 34 to permit storage of the dummy bit may be uncoupled. In some cases, however, a switch may exist between the output format converter 66 and the memory 34 to permit selective discarding of the dummy bit output. In this way, the output format converter 66 may generate a control signal used to operate the switch to permit transmission of the dummy bit output to the memory 34. When the output format converter 66 outputs more than one dummy bits, it is noted that a subset of the dummy bits may be discarded and a subset of the dummy bits may be stored in memory 34. Furthermore, in the cases where there are more than one dummy bits, the subset of the dummy bits to be stored in the memory 34 may be interleaved with the ECC bit output during transmission and/or storage with the memory 34.

Figure 11:
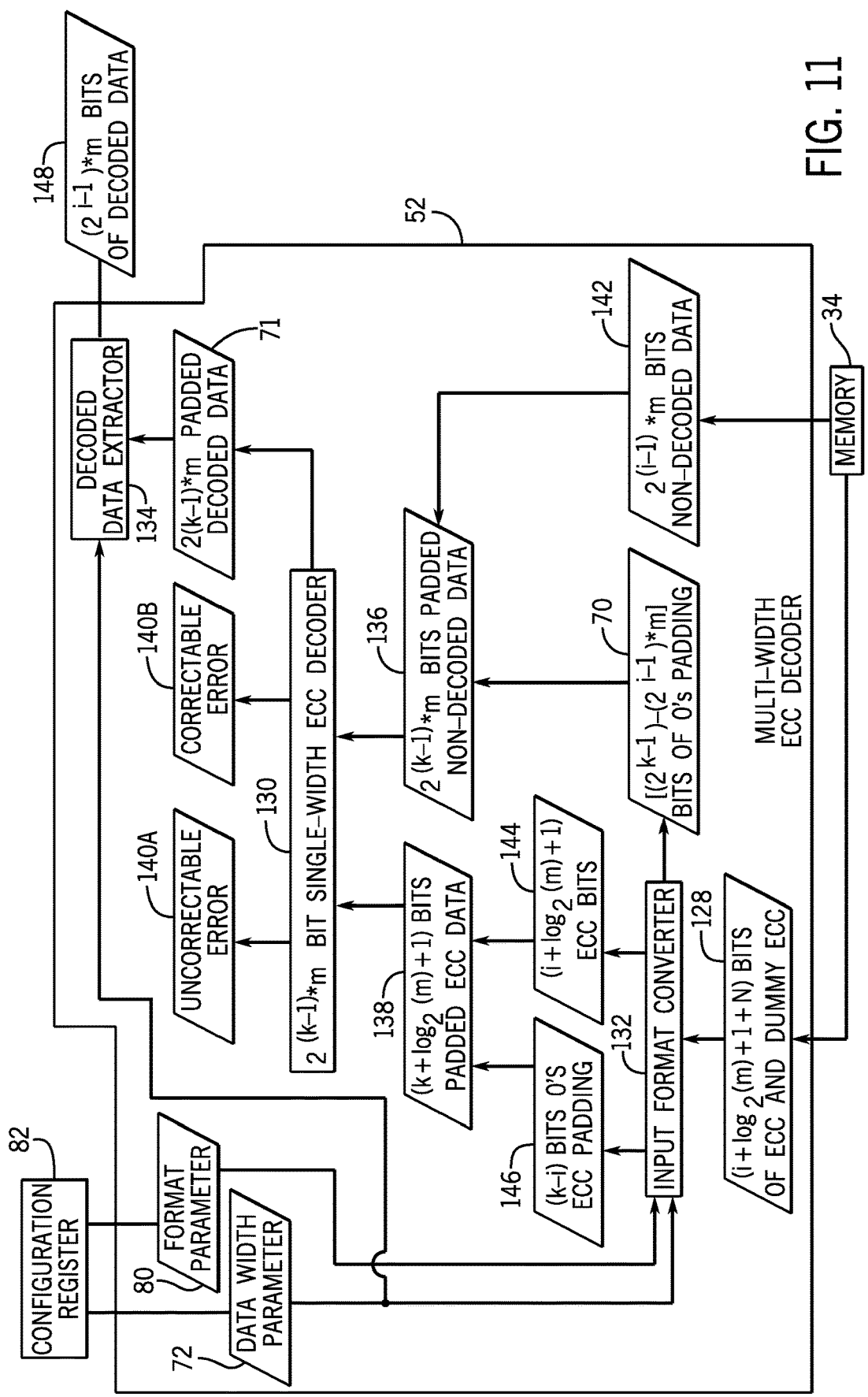
FIG. 11 is a block diagram of an example k*m bit decoding circuitry of the multi-width ECC decoder of FIG. 3, in accordance with an embodiment.
Figure 12:
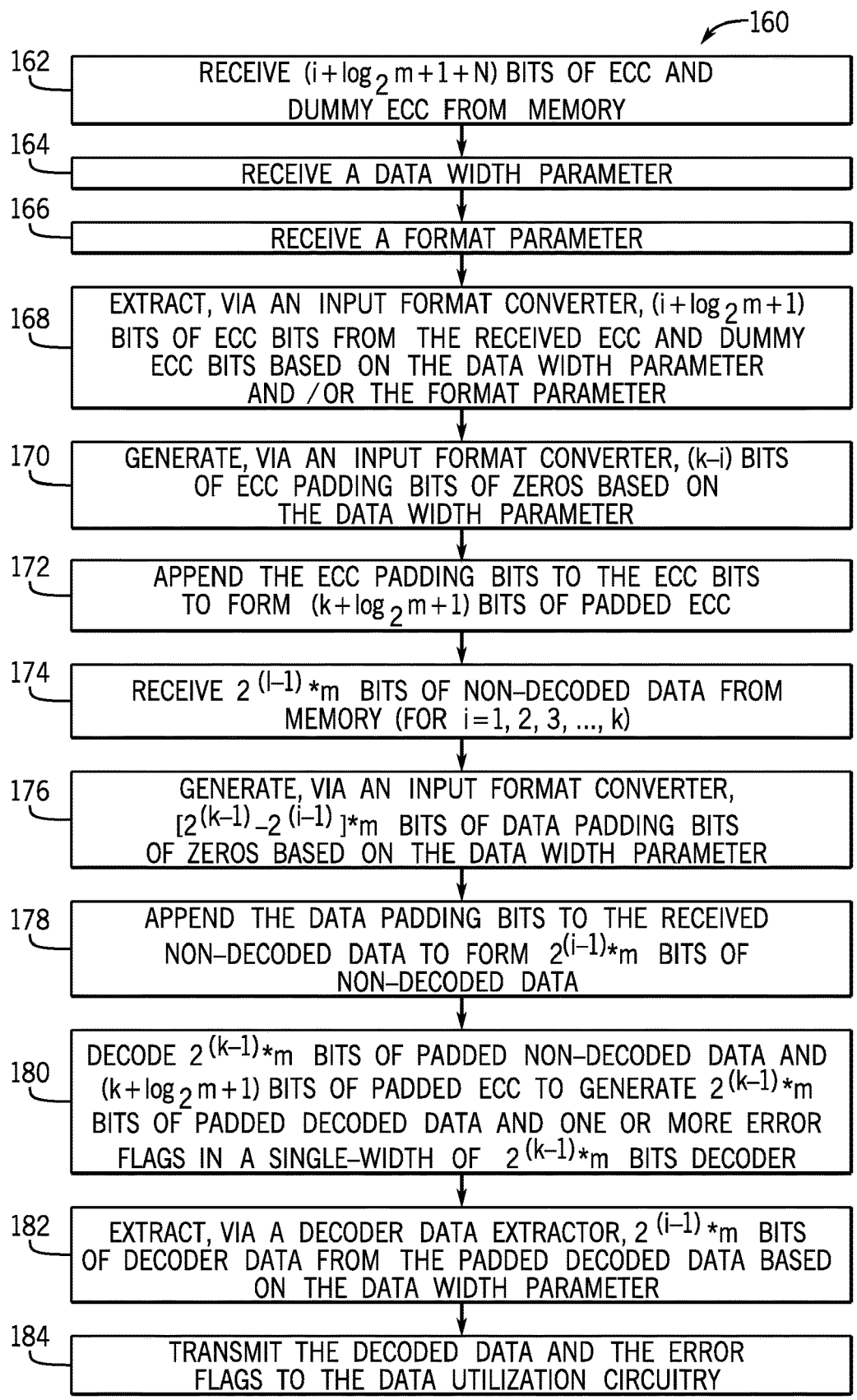
FIG. 12 is a method for operating the multi-width ECC decoder of FIG. 11, in accordance with an embodiment.

When a reverse operation is performed (e.g., via input format converter of FIG. 11), as is described with regards to FIG. 11 and FIG. 12, the output format converter 66 may add the dummy bit that was discarded to an original bit position as received from the single-width encoder 64A and may return the value of the dummy bit to 0, such that a decoder may process the bits. In this way, the output format converter 66 may generate a dummy bit to be included with the ECC bits during processing by the decoder. For example, a dummy bit may be appended to a most significant bit position relative to the ECC bits and have a value of 0 (e.g., 0XXXXX) when performing the reverse operation. In some cases, discarding some or all of the dummy bit values may improve signal integrity and reduce power consumption of the memory interface. Discarding some or all of the dummy bit values may also reduce routing and space used on a PCB board.

Figure 10:
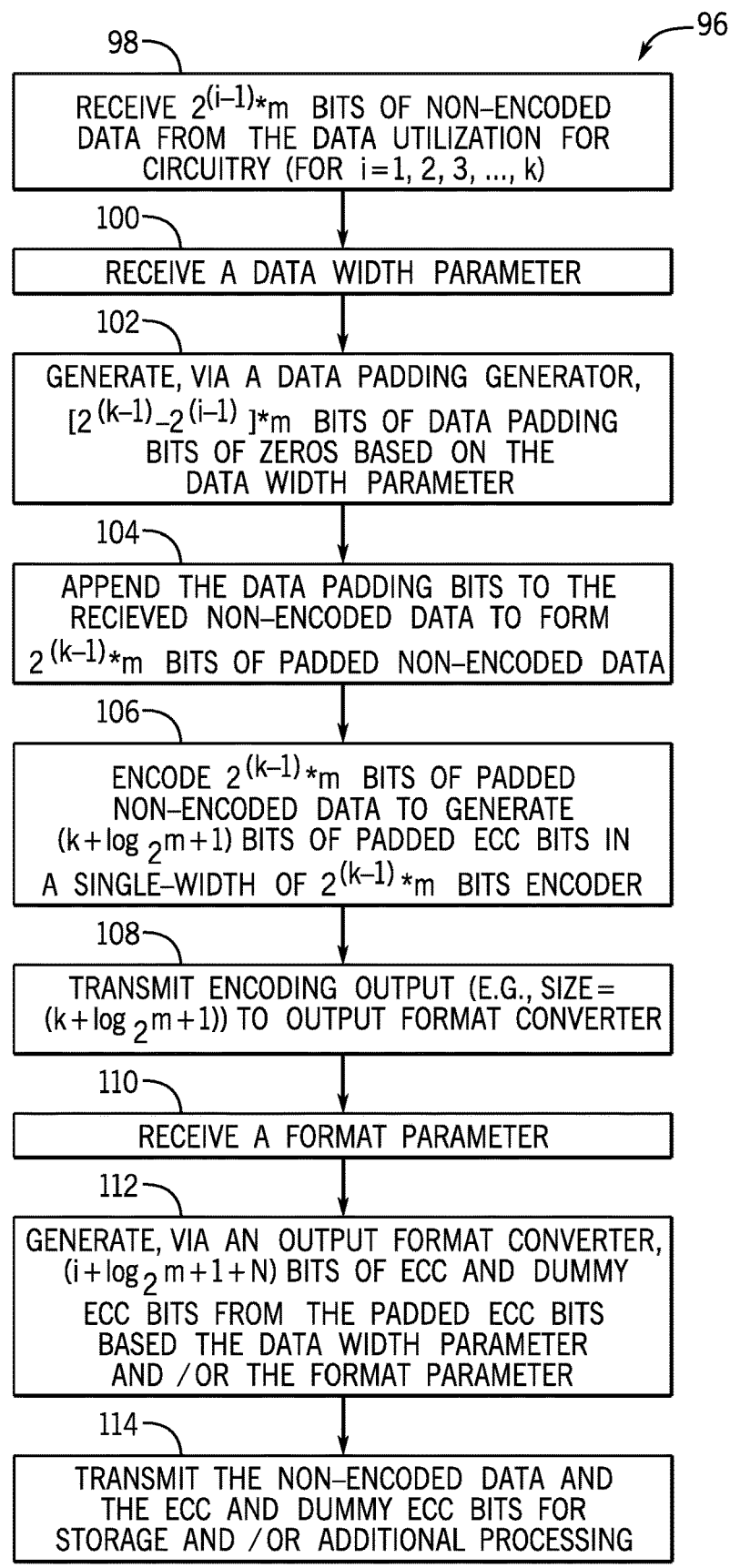
FIG. 10 is a method for operating the multi-width ECC encoder of FIG. 5, in accordance with an embodiment.

To elaborate, FIG. 10 is a method 96 for operating the multi-width ECC encoder 50 to encode non-encoded data 68 for use during ECC operations. Generally the method 96 includes receiving $2^{(i-1)}*m$ bits of non-encoded data from the data utilization circuitry (for i=1, 2, 3, . . . , k) (block 98), receiving a data width parameter (block 100), generating, via a data padding generator, $[2^{(k-1)}-2^{(i-1)}]*m$ bits of data padding bits of zeros based on the data width parameter (block 102), appending the data padding bits to the received non-encoded data to form $2^{(k-1)}*m$ bits of padded non-encoded data (block 104), encoding $2^{(k-1)}*m$ bits of padded non-encoded data to generate (k+log 2(m)+1) bits of padded ECC bits in a single-width of $2^{(k-1)}*m$ bits encoder (block 106), transmitting encoding output (e.g., size=(k+log 2(m)+1)) to output format converter (block 108), receiving a format parameter (block 110), generating, via the output format converter, (i+log 2(m)+1+N) bits of ECC and dummy ECC bits from the padded ECC bits based the data width parameter and/or the format parameter (block 112), and transmitting the non-encoded data and the ECC and dummy ECC bits for storage and/or additional processing (block 112). The method 96 may be implemented at least in part by executing instructions stored in a tangible, non-transitory, computer-readable medium, such as the memory 34, using processing circuitry, such as the compiler 22 and/or the computing system 18. Although the method 96 is described as performed by multi-width ECC encoder 50, it is noted that the data utilization circuitry 54 or other processing circuitry may perform some of the operations described below. It is noted although the method 96 is presented in a particular order, various suitable orders of operations may be used when performing the method 96.

Thus, in some embodiments, the multi-width memory interface circuitry 48 may receive $2^{(i-1)}*m$ bits of non-encoded data 68 (block 98), for i=1, 2, 3, ..., k. The data utilization circuitry 54 may transmit the non-encoded data 68 to the multi-width memory interface circuitry 48 and to the memory 34. Some processes or functions performed by the data utilization circuitry 54 may result in data being generated that is to be stored in memory 34. Some data may be particularly vulnerable to noise or alternation, and thus may be desired to be checked for errors after retrieval from the memory 34. In at least these cases, the data utilization circuitry 54 may transmit the data to the multi-width memory interface circuitry 48 as non-encoded data 68 to be used in the generation of ECC bits for use when verifying the data stored in memory 34.

Since the width of the non-encoded data 68 is a variable, using a single-width encoder 64 to encode the non-encoded data 68 may involve padding the non-encoded data 68 a data padding 70 that also has a variable size based on the width of the non-encoded data 68. Thus, at any time before generating the data padding 70, the multi-width memory interface circuitry 48 may receive a data width parameter 72 (block 100). In some cases, in response to receiving the non-encoded data 68, multi-width memory interface circuitry 48 may read the configuration register 82 to determine the data width parameter to reference when generating the data padding 70. The data width parameter 72 may define a data width of the non-encoded data 68. The data utilization circuitry 54 may load the data width parameter 72 into the configuration register 82 and/or the computing system 18 may cause the loading of the data width parameter 72 into the configuration register 82 at a time of configuration of the integrated circuit 12.

After receiving the non-encoded data, the multi-width ECC encoder 50 may generate $[2^{(k-1)}-2^{(i-1)}]*m$ bits of data padding 70 based on the data width parameter 72 by using a data padding generator 62 (block 102). The multi-width ECC encoder 50 may append the data padding 70 to the $2^{(i-1)}*m$ bits of non-encoded data 68 to form $2^{(k-1)}*m$ bits of padded non-encoded data 71 (block 104). The non-encoded data 68 received from the data utilization circuitry 54 may have one width of a variety of widths since the multi-width ECC encoder 50 may process the variety of widths. To make the non-encoded data 68 able to be processed by the multi-width memory interface circuitry 48, bits may be appended to the non-encoded data 68 to effectively increase a data width of the non-encoded data 68. Appending the data padding 70 to the non-encoded data 68 may happen automatically (e.g., via structural couplings within the single-width encoder 64) or may happen external to the single-width encoder 64 such as a combining of data through electrical couplings or within a particular component that enables the appending of data to other data. For example, the data padding 70 may be separately transmitted to the single-width encoder 64 from the non-encoded data 68, but may be received at a same input terminal, such that the single-width encoder 64 receives the data padding 70 serially or parallel to the non-encoded data 68 in response to the data being clocked into the single-width encoder 64. The non-encoded data 68 may be appended up to a width equal to the width used by the single-width encoder 64 when encoding the non-encoded data 68.

After appending the bits of padding data to the non-encoded data 68, the multi-width ECC encoder 50 may encode the $2^{(k-1)}*m$ bits of padded non-encoded data 71 in a $2^{(k-1)}*m$ bits single-width encoder 64B (block 106). The encoding may generate an encoding output of (k+log 2(m)+1) bits of padded ECC data 73 that includes a combination of dummy ECC bits and ECC bits. The single-width encoder 64 may generate a number of dummy ECC bits equal to (k-i) bits and may generate a number of ECC bits equal to (i+log 2(m)+1) bits.

The multi-width ECC encoder 50 may transmit the encoding output (e.g., size=(k+log 2(m)+1) bits) from the single-width encoder 64B to the output format converter 66 (block 108). The output format converter 66 may receive the encoding output (e.g., output of (k+log 2(m)+1) bits of padded ECC data 73) and generate new dummy ECC bits and ECC bits according to the format specified by the parameters received from the configuration register 82 (e.g., represented by (i+log 2(m)+1) bits of ECC and N bits of dummy ECC 81). Since a width of data transmitted to the single-width encoder 64 is variable, a number of ECC bits of non-encoded data 68 may be unknown and/or indistinguishable from the dummy bits in the encoding output. The output format converter 66 may correlate a data width of the non-encoded data 68 to a number of expected ECC bits, and thus know to transmit that number of expected ECC bits onto the memory 34.

Thus, at any time before generating dummy ECC bits and ECC bits, the multi-width ECC encoder 50 may receive a one or more format parameters 80 (block 110). In some cases, in response to receiving the encoding output, the output format converter 66 may read the configuration register 82 to determine parameters to reference when generating ECC bits and/or dummy ECC bits. The format parameters 80 may define to what value to set the dummy bit data, whether or not to discard or add the dummy bits, and/or whether to interleave the dummy bits with the non-encoded data 68 before transmission from the output format converter 66. The data utilization circuitry 54 may load the format parameters 80 into the configuration register 82 and/or the computing system 18 may cause the loading of the format parameters 80 into the configuration register 82 at a time of configuration of the integrated circuit 12.

After receiving the encoding output at the output format converter 66, the data width parameter 72, and/or the format parameter 80, the multi-width ECC encoder 50 may generate, via the output format converter 66, dummy ECC bits and ECC bits using the encoding output and based on the data width parameter 72 and/or the format parameter 80 (block 112). The output format converter 66 may thus take the output from the single-width encoder 64 and turn the output into a useable format for the memory 34 regardless of the data width of the non-encoded data 68. After generating the dummy ECC bits and/or the ECC bits, the multi-width ECC encoder 50 may transmit the ECC bits and/or dummy ECC bits along with the non-encoded data 68 for storage and/or additional processing (block 114). The multi-width ECC encoder 50 may transmit the ECC bits and/or dummy ECC bits for storage in the memory 34 and/or another suitable storage medium (e.g., memory 34).

As part of ECC operations, the ECC bits stored in the memory 34 may be used to verify whether the non-encoded data 68 retrieved from the memory 34 is error-free or may be used to rectify an error found within the non-encoded data

68 retrieved from the memory 34. To do so, ECC bits may be decoded. Encoding operations are described above, however, FIG. 11 and FIG. 12 detail decoding operations of the multi-width memory interface circuitry 48.

FIG. 11 is a block diagram of an example multi-width ECC decoder 52, which supports k data widths, $2^{(i-1)}$*m for i=1, 2, 3, . . . , k. The maximum data width of the multi-width ECC decoder 52 is $2^{(k-1)}$*m bits while the minimum data width of the multi-width ECC decoder 52 is m bits. Memory 34 may transmit $2^{(i-1)}$*m bits of non-decoded data 142 and (i+log 2(m)+1+N) bits of ECC and dummy ECC (e.g., ECC and dummy ECC bits 128) to the multi-width ECC decoder 52. The ECC and dummy ECC bits 128 may include (i+log 2(m)+1) bits of ECC bits corresponding to the non-decoded data 142 and N bits of dummy ECC bits corresponding to the ECC bits. The dummy ECC bits which may be interleaved in the ECC and dummy ECC bits 128.

The multi-width ECC decoder 52 may include a single-width decoder 130 (e.g., ECC decoder) and an input format converter 132. In some cases, the multi-width ECC decoder 52 further includes a decoded data extractor 134. In general, the single-width decoder 130 takes $2^{(k-1)}$*m bits of padded non-decoded data 136 and (k+log$_2$(m)+1) bits of padded ECC (e.g., input data 138) to generate $2^{(k-1)}$*m bits of output data (e.g., padded non-encoded data 71) and one or more error flags 140 (e.g., error flag 140A, error flag 140B). The single-width decoder 130 may receive $2^{(i-1)}$*m bits of non-decoded data 142 from the memory 34 and $[2^{(k-1)}-2^{(i-1)}]$*m bits of data padding 70 from the input format converter 132 as its $2^{(k-1)}$*m bits of padded non-decoded data 136, and (i+log 2(m)+1) of ECC bits 144 and (k-i) bits of 0's ECC padding 146 from the input format converter 132 as the (k+log$_2$(m)+1) bits of padded ECC (e.g., input data 138). The non-decoded data 142 from the memory 34 may be padded with the data padding 70 via the input format converter 132, where the data padding 70 may have a data width equal to $[2^{(k-1)}-2^{(i-1)}]$*m bits and a value equal to 0. In this way, the width of the $2^{(k-1)}$*m bits of padded non-decoded data 136 equals $2^{(k-1)}$*m bits. The ECC bits 144 from the input format converter may be padded with the ECC padding 146 via the input format converter 132, where the ECC padding 146 may have a data width equal to (k-i) bits and a value equal to 0. In this way, the width of the padded ECC (e.g., input data 138) is (k+log 2(m)+1) bits.

The single-width decoder 130 may receive the padded ECC (e.g., input data 138) as a first input and the $2^{(k-1)}$*m bits of padded non-decoded data 136 as a second input. The single-width decoder 130 may use hamming ECC operations to use the first input to identify errors in the second input. If any errors in the second input are found, the single-width decoder 130 may generate an uncorrectable error flag 140A and/or a correctable error flag 140B. The correctable error flag 140B may indicate to the data utilization circuitry 54 that the non-decoded data 142 includes one or more corrected errors and, however, the decoded data 148 output from the single-width decoder 130 is correct. The uncorrectable error flag 140A may indicate to the data utilization circuitry 54 that the non-decoded data 142 includes one or more uncorrected errors and the decoded data 148 output from the single-width decoder 130 is incorrect. Absence of the uncorrectable error flag 140A and/or the correctable error flag 140B may indicate that the non-decoded data 142 from the memory 34 includes zero errors and the decoded data 81 output from the single-width decoder 130 is correct relative to the original non-encoded data 142. In some cases, the correctable error flag 140B is transmitted or a no error flag is transmitted in place of the correctable error flag 140B to communicate a lack of correctable error in the non-decoded data 142 output from the memory 34, and the uncorrectable error flag 140A is transmitted or a no error flag is transmitted in place of the uncorrectable error flag 140A to communicate a lack of uncorrectable error in the non-decoded data 142 output from the memory 34. It is noted that other methods of decoding other than hamming ECC may yield different output proportions than what is listed above, and thus may be handled in a modified manner by the input format converter 132. Similar to the output format converter 66, the input format converter 132 may include hardware, software, or a combination of the two to perform the translation operations described herein. In this way, the input format converter 132 may include or be processing circuitry similar to that used as the processors 16 or other suitable processing or control circuitry.

The input format converter 132 may receive the ECC and dummy ECC bits 128, that includes (i+log 2(m)+1) bits of ECC bits and N bits of dummy ECC bits from the memory 34. The ECC and dummy ECC bits 128 from the memory 34 may be interleaved and the value of the dummy bits may be equal to 0 or 1 in the same format of the output of the output format converter 66. The input format converter 132 may perform reverse operations of the output format converter 66. The input format converter 132 may remove the N dummy ECC bits from the ECC and dummy ECC bits 128 to generate (i+log 2(m)+1) bits of ECC bits 144 based on the format parameter 80 and/or the data width parameter 72. The input format converter 132 may generate (k-i) bits of ECC padding 146 having a value equal to 0 based on the data width parameter 72. The input format converter 132 may generate $[2^{(k-1)}-2^{(i-1)}]$*m bits of data padding 70 having a value equal to 0 based on the data width parameter 72. The ECC bits 144, the ECC padding 146, and the data padding 70 may be used by the single-width decoder 130 for use in verifying the integrity of the non-decoded data 142 and/or correcting the non-decoded data 142 if there are one or more correctable errors in the non-decoded data 142. Since the data width of the single-width decoder 130 may be fixed for a particular integrated circuit 12, multiple data widths may be processed at least in part due to the input format converter 132 facilitating the translation between the data width of the non-decoded data 142 and the data width of the single-width decoder 130 (e.g., generating and adding the data padding 70 to the non-decoded data 142).

The input format converter 132 may receive the data width parameter 72 that indicates a data width of the non-encoded data 68 or non-decoded data 142. In some cases, the input format converter 132 also receives the format parameters 80 from the configuration register 82. The format parameters 80 may specify whether ECC bits output from the output format converter 66 are interleaved with the dummy bits and/or what value to set the dummy bits to (e.g., 0, 1, some other voltage value between the system definition for a logical low voltage and the system definition for a logical high voltage). Thus, the input format converter 132 may reference the data width parameter 72 and/or the format parameters 80 to reverse the formatting of the output format converter 66. The output from the input format converter 132 that is received by the single-width decoder 130 may be compatible with the input format of the single-width decoder 130. In some cases, the input format of the single-width decoder 130 may be different from an output format of the single-width encoder 64, and thus, sometimes the input format converter 132 may reference different format parameters 80 than the output format converter 66 to convert the data into a suitable format. It is noted that the input format converter 132 and/or the decoded data extractor 134, in some cases, may not apply any adjustment to respective inputs to the circuitry, such as may be the case when an input bit width to the input format converter 132 and/or the decoded data extractor 134 equals an output bit width.

The decoded data extractor 134 may remove $[2^{(k-1)}-2^{(i-1)}]*m$ bits of padding bits of the padded non-encoded data 71 in the more significant positions. The decoded data extractor 134 may receive the data width parameter 72 that indicates a data width of non-decoded data 142, which may be the same as the data width of the non-encoded data 68. The decoded data extractor 134 may remove the padding bits in the padded non-encoded data 71 based on the data width parameter 72.

To elaborate, FIG. 12 is a method 160 for operating the multi-width ECC decoder 52 to decode a combination of the ECC and dummy ECC bits 128 and the non-decoded data 142 bits for use during ECC operations. Generally, the method 160 includes receiving (i+log 2(m)+1+N) bits of a combination of ECC and dummy ECC from memory (block 162), receiving a data width parameter (block 164), receiving a format parameter (block 166), extracting, via an input format converter, (i+log 2(m)+1) bits of ECC bits from the combination of ECC and dummy ECC bits based the data width parameter and/or the format parameter (block 168), generating, via an input format converter, (k-i) bits of ECC padding bits of zeros based the data width parameter (block 170), appending the ECC padding bits to the ECC bits to form (k+log 2(m)+1) bits of padded ECC (block 172), receiving $2^{(i-1)}*m$ bits of non-decoded data (block 174), generating, via an input format converter, $[2^{(k-1)}-2^{(i-1)}]*m$ bits of data padding of zeros based on the data width parameter (block 176), appending the data padding to the received non-decoded data to form $2^{(k-1)}*m$ bits of padded non-decoded data (block 178), decoding $2^{(k-1)}*m$ bits of padded non-decoded data and (k+log 2(m)+1) bits of padded ECC to generate $2^{(k-1)}*m$ bits of padded decoded data and one or more error flags in a single-width of $2^{(k-1)}*m$ bits decoder (block 180), extracting, via a decoded data extractor, $2^{(i-1)}*m$ bits of decoded data from the padded decoded data based the data width parameter (block 182), and transmitting the decoded data and the error flags to the data utilization circuitry (block 184). The method 160 may be implemented at least in part by executing instructions stored in a tangible, non-transitory, computer-readable medium, such as the memory 34, using processing circuitry, such as the compiler 22 and/or the computing system 18. Although the method 160 is described as performed by multi-width ECC decoder 52, it is noted that the data utilization circuitry 54 or other processing circuitry may perform some of the operations described below. It is noted although the method 160 is presented in a particular order, various suitable orders of operations may be used when performing the method 160.

Thus, in some embodiments, the multi-width ECC decoder 52 may receive (i+log 2(m)+1+N) bits of a combination of the ECC and dummy ECC bits 128 from memory 34 (block 162), which includes (i+log 2(m)+1) ECC bits for $2^{(i-1)}*m$ bits and N bits of dummy ECC bits. The input format converter 132 may receive the combination of the ECC and dummy ECC bits 128 from the memory 34. The input format converter 132 may translate a format of the combination of the ECC and dummy ECC bits 128 into a format usable by the single-width decoder 130. For example, the input format converter 132 may append the ECC padding 146 bits to the ECC bits 144 before transmitting the ECC bits 144 to the single-width decoder 130.

Additionally or alternatively, the input format converter 132 may reference the data width parameter 72 and/or the format parameters 80 when translating the format of the ECC and dummy ECC bits 128 into the format compatible with the single-width decoder 130. Thus, at any time before generating a translation output to be transmitted to the single-width decoder 130, the multi-width memory interface circuitry 48 may receive a data width parameter 72 (block 164) and/or may receive one or more format parameters 80 (block 166). In some cases, in response to receiving the encoding output, the input format converter 132 may read the configuration register 82 to determine parameters to reference when generating ECC bits 144, ECC padding 146 bits, and/or data padding 70 bits. The data width parameter 72 may define a data width of the non-decoded data 142 and the format parameters 80 may define the positions of dummy ECC bits and/or ECC bits within the (i+log 2(m)+1+N) bits of the combination of the ECC and dummy ECC bits 128, what value to set the dummy ECC bit data, whether or not to discard the dummy ECC bits, and/or whether to interleave the dummy ECC bits with the non-decoded data 142 before transmission from the input format converter 132. The data utilization circuitry 54 may load the data width parameter 72 and/or the format parameters 80 into the configuration register 82 and/or the computing system 18 may cause the loading of the data width parameter 72 and/or the format parameters 80 into the configuration register 82 at a time of configuration of the integrated circuit 12.

After receiving the combination of the ECC and dummy ECC bits 128, the data width parameter 72, and/or the format parameter 80, the multi-width ECC decoder 52 may extract, via the input format converter 132, (i+log 2(m)+1) bits of ECC bits from the combination of the ECC and dummy ECC bits 128 based the data width parameter 72 and/or the format parameter 80 (block 168). The multi-width ECC decoder 52 may generate, via the input format converter 132, (k-i) bits of ECC padding bits of zeros based the data width parameter 72 (block 170). The multi-width ECC decoder 52 may append, via the input format converter 132, the ECC padding bits to the ECC bits to form (k+log 2(m)+1) bits of padded ECC bits (e.g., input data 138) (block 172). As described above, the input format converter 132 may generate the translation output based on the data width parameter 72 and/or the format parameter 80 to reverse any formatting applied by the output format converter 66. In some cases, when the reverse operation is performed, the input format converter 132 may return any dummy ECC bits having a non-zero value to an original bit position and/or may return the value of the dummy ECC bits to 0 (e.g., as originally received from the single-width encoder 64B), such that the single-width decoder 130 may process the padded ECC bits (e.g., input data 138) as the translation output. For example, a dummy ECC bit may be returned to a most significant bit position relative to the ECC bits 144 and may be set to a value of 0 (e.g., 0XXXXX) when performing the reverse operation. When performing the reverse operation, the input format converter 132 may return the ECC bits 144 and the ECC padding 146 bits to a format output by the single-width encoder 64B and/or used by the single-width decoder 130.

The multi-width ECC decoder 52 may receive the $2^{(i-1)}*m$ bits of non-decoded data 142 from the memory 34, for i=1, 2, 3, . . . , k, to be used in the ECC operation of the single-width decoder 130 (block 174). The non-decoded data 142 received at the single-width decoder 130 may be the same data received from the data utilization circuitry 54 at the single-width encoder 64B and/or may include one or more errors introduced from being stored in memory 34 or transmitted between the data utilization circuitry 54 and the memory 34. The single-width decoder 130 may use the non-decoded data 142 from the memory 34 and the outputs of the input format converter 132 to determine whether the non-decoded data 142 is error-free or has a correctable and/or uncorrectable error, and to correct the errors when the errors are correctable.

To do so, the multi-width ECC decoder 52 may generate, via the input format converter 132, $[2^{(k-1)}-2^{(i-1)}]*m$ bits of data padding bits of data padding 70 based on the data width parameter (block 176). The data padding 70 may include zeros. The multi-width ECC decoder 52 may append, via the input format converter 132, the data padding 70 to the non-decoded data 142 from memory 34 (block 178). The non-decoded data 142 received by the multi-width ECC decoder 52 from memory 34 may have a data width different than the data width of the single-width decoder 130. The data padding 70 and the ECC padding 146 may be appended to the non-decoded data 142 and the ECC bits 144 respectively to effectively increase a data width of the non-decoded data 142 and the ECC bits 144. Appending the data padding 70 to the non-decoded data 142 and/or the ECC padding 146 to the ECC bits 144 may occur automatically (e.g., via structural couplings within the single-width decoder 130) or may occur external to the single-width decoder 130, such as via a combining of data through electrical couplings or within a particular component that enables the appending of data to other data. For example, the data padding 70 may be separately transmitted to the single-width decoder 130 from the non-decoded data 142, but may be received at a same input terminal, such that the single-width decoder 130 receives the data padding 70 serially or parallel to the non-decoded data 142 in response to the data being clocked into the single-width decoder 130. The non-decoded data 142 may be appended up to a data width equal to the data width used by the single-width decoder 130 when verifying the non-decoded data 142.

After generating or obtaining data of a suitable data width for the single-width decoder 130, the multi-width ECC decoder 52 may decode $2^{(k-1)}*m$ bits of the $2^{(k-1)}*m$ bits of padded non-decoded data 136 and $(i+\log 2(m)+1)$ bits of the padded ECC (e.g., input data 138) and generate $2^{(k-1)}*m$ bits of padded non-encoded data 71 in the single-width decoder 130 (block 180). The multi-width ECC decoder 52 may extract, via a decoded data extractor 134, $2^{(i-1)}*m$ bits of decoded data 148 from the padded non-encoded data 71 based on the data width parameter 72 (block 182).

The single-width decoder 130 may receive the padded ECC bits (e.g., input data 138) as a first input and the $2^{(k-1)}*m$ bits of padded non-decoded data 136 as a second input. The single-width decoder 130 may use hamming ECC operations to use the first input to identify errors in the second input. If any errors in the second input are found, the single-width decoder 130 may generate a correctable error flag 140B and/or an uncorrectable error flag 140A. The correctable error flag 140B may indicate to the data utilization circuitry 54 that the output of non-decoded data 142 from the memory 34 may include one or more correctable errors. Absence of the correctable error flag 140B and uncorrectable error flag 140A may indicate that the non-decoded data 142 from the memory 34 includes no errors. The correctable error flag 140B may indicate that the non-decoded data 142 from the memory 34 includes an error and, however, the errors have been corrected by the single-width decoder 130 in its output of the $2^{(k-1)}*m$ bits of padded non-encoded data 71. The uncorrectable error flag 140A may indicate that both the non-decoded data 142 from the memory 34 and the decoded data 148 include an error. In some cases, the correctable error flag 140B and/or the uncorrectable error flag 140A are transmitted or a no error flag is transmitted in place of the correctable error flag 140B and/or the uncorrectable error flag 140A to communicate a lack of error in the non-decoded data 142 output from the memory 34 or in the decoded data 148.

After verification of the non-decoded data 142, the multi-width ECC decoder 52 may transmit the decoded data 148, the correctable error flag 140B and/or the uncorrectable error flag 140A to the data utilization circuitry 54 (block 184). The data utilization circuitry 54, in response to receiving the correctable error flag 140B and/or the uncorrectable error flag 140A, may perform an operation in response to the non-decoded data 142 and/or the decoded data 148 being corrupted. For example, the data utilization circuitry 54 may generate an alert to signal to other applications or an operator (e.g., via a graphical user interface, via a control signal causing an indicator to emit light, via an interrupt to processors) that the decoded data 148 includes a number of errors greater than a threshold number of errors, and is thus unusable or is to be used with caution. The threshold number of errors may correspond to a number of errors that the single-width decoder 130 is able to resolve (e.g., one error). When the data utilization circuitry 54 does not receive the correctable error flag 140B and/or the uncorrectable error flag 140A, the data utilization circuitry 54 may use the non-decoded data 142 from the memory 34 in a variety of functions or applications without additional considerations to errors being present.

By using the above-described techniques and examples, multi-width memory interface circuitry having multi-width ECC circuitry with dynamic configurability may be provided. The multi-width memory interface circuitry may permit application-specific configuration and/or use-case specific programming of the data channels between data utilization circuitry and memory as opposed to included separate ECC circuitry to accommodate different data widths being transmitted between the data utilization circuitry and the memory. Other benefits include realizing FPGA and/or integrated circuit system silicon area and power savings through utilizing the dynamic configurability improvements since dynamic multi-width memory interface circuitry communicating according to certain configuration (e.g., where dummy bits output from an encoder are discarded) may reside in a smaller footprint than other ECC circuitry that use multiple ECC circuitry to process different data widths. Furthermore, these techniques described herein permit tailoring the configuration of the multi-width memory interface circuitry on a per-use basis based on transmission parameters that define bandwidth and/or other design considerations for the particular data transaction.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit, comprising:
data utilization circuitry configurable to generate first data characterized by a first data width; and
configurable error correction code (ECC) circuitry communicatively coupled between the data utilization circuitry and a memory comprising a memory interface, wherein the configurable ECC circuitry comprises an encoder having a second data width, and wherein the configurable ECC circuitry is configurable to:
receive the first data from the data utilization circuitry;
adjust the first data characterized by the first data width into second data characterized by the second data width configurable to be processed by the encoder to generate ECC bits before being stored in the memory, wherein the encoder is configurable to generate the ECC bits based on a logarithmic relationship between the first data width and the second data width;
process, via an output format converter, the ECC bits to pad the ECC bits with one or more dummy ECC bits to match a width of the ECC bits padded by the one or more dummy ECC bits to a width of the memory interface; and
write the ECC bits padded by the one or more dummy ECC bits to the memory.

2. The integrated circuit of claim 1, wherein the encoder comprises a fixed data width as the second data width that does not change between two accesses of the memory.

3. The integrated circuit of claim 1, wherein the data utilization circuitry is configurable to generate the first data at a first time and third data comprising the second data width at a second time.

4. The integrated circuit of claim 1, wherein the first data comprises non-encoded data generated by the data utilization circuitry.

5. The integrated circuit of claim 4, wherein the first data is transmitted with padding data to the configurable ECC circuitry, and wherein the first data and the padding data collectively are characterized by the second data width.

6. The integrated circuit of claim 1, wherein the ECC bits are characterized by a third data width, and wherein the configurable ECC circuitry comprises:
a first format converter configurable to adjust the ECC bits from the third data width to a format compatible with the memory.

7. The integrated circuit of claim 6, wherein the third data width is represented by a relationship:

width=$k$+(log$_2$($m$)+1)

wherein k corresponds to a multiplier to use to increase the second data width to the first data width or a number of data widths, and wherein m corresponds to a number of bits equal to a minimum data width of the configurable ECC circuitry.

8. The integrated circuit of claim 6, wherein the second data comprises the first data without comprising dummy bits.

9. The integrated circuit of claim 6, wherein the first data is adjusted via adding data padding, wherein the data padding comprises one or more dummy bits, and wherein each dummy bit comprises no data of the first data.

10. The integrated circuit of claim 1, wherein the one or more dummy ECC bits are configurable as logical low values inserted to one or more predetermined bit positions.

11. The integrated circuit of claim 10, wherein the one or more dummy ECC bits are configurable to be interleaved with the ECC bits at the one or more predetermined bit positions.

12. The integrated circuit of claim 1, wherein the width of the memory interface corresponds to a number of bits able to be transmitted via a plurality of parallel couplings to the memory interface from a multi-width memory interface circuitry.

13. The integrated circuit of claim 1, wherein the output format converter is configurable to generate the one or more dummy ECC bits based on a data width parameter and a format parameter received from a configuration register, wherein the data padding generator is configurable to adjust the first data into the second data based on the format parameter, and wherein the configuration register is configurable to be programmed with the data width parameter and the format parameter when receiving configuration data corresponding to programmable logic circuitry that generated the first data.

14. A method, comprising:
receiving first input data characterized by a first data width;
adjusting the first input data into second data characterized by a second data width;
generating error correction code (ECC) bits characterized by a third data width using an encoder characterized by the second data width, wherein the ECC bits are generated based on a logarithmic relationship between the third data width and the second data width;
processing, via an output format converter configurable to couple to a memory via a memory interface characterized by a fourth data width, the ECC bits to pad the ECC bits with one or more dummy ECC bits to match the fourth data width; and
writing the ECC bits padded by the one or more dummy ECC bits to the memory via the memory interface.

15. The method of claim 14, comprising:
receiving third input data characterized by a fifth data width different from the first data width and the second data width;
adjusting the third input data into fourth data characterized by the second data width; and
generating additional ECC bits using the encoder.

16. The method of claim 14, comprising:
reading the ECC bits padded by the one or more dummy ECC bits from the memory;
decoding the ECC bits using a decoder characterized by a fifth data width to generate the first input data characterized by the first data width from the ECC bits; and
in response to decoding the ECC bits, transmitting the first input data from the decoder to data utilization circuitry.

17. A device comprising:
a format converter communicatively coupled to a memory via a memory interface having a first data width; and
encoding circuitry comprising an input characterized by a second data width communicatively coupled to the format converter, wherein the encoding circuitry is configurable to receive input data having a third data width padded to the second data width and to generate first data having a fourth data width;

wherein the format converter is configurable to:
receive the first data characterized by the fourth data width from the encoding circuitry, wherein the first data comprises error correction code (ECC) bits generated by the encoding circuitry, wherein the first data is generated based on a logarithmic relationship between the fourth data width and the second data width;
generate second data at least in part by padding the first data with one or more dummy ECC bits, wherein the second data is characterized by the first data width; and
write the second data to the memory via the memory interface.

18. The device of claim 17, wherein the fourth data width is equal to a first relationship:

$$\text{width} = k + (\log_2(m) + 1)$$

wherein k corresponds to a multiplier to use to increase the third data width to the fourth data width or a number of data widths, and wherein m corresponds to a number of bits equal to a minimum data width of the encoding circuitry.

19. The device of claim 17, wherein the format converter is configurable to adjust data from the memory to be input into decoding circuitry based at least in part on a data width parameter read from a configuration register.

* * * * *